United States Patent
Bonetti et al.

(10) Patent No.: US 10,243,563 B2
(45) Date of Patent: Mar. 26, 2019

(54) VOLTAGE LEVEL SHIFTER MONITOR WITH TUNABLE VOLTAGE LEVEL SHIFTER REPLICA CIRCUIT

(71) Applicant: INTEL CORPORATION, Santa Clara, CA (US)

(72) Inventors: Andrea Bonetti, Prilly (CH); Jaydeep P. Kulkarni, Portland, OR (US); Carlos Tokunaga, Hillsboro, OR (US); Minki Cho, Hillsboro, OR (US); Pascal A. Meinerzhagen, Hillsboro, OR (US); Muhammad M. Khellah, Tigard, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/394,296

(22) Filed: Dec. 29, 2016

(65) Prior Publication Data

US 2018/0191347 A1 Jul. 5, 2018

(51) Int. Cl.
*H03L 5/00* (2006.01)
*H03K 19/0175* (2006.01)
*H03K 19/0185* (2006.01)
*H03K 19/21* (2006.01)

(52) U.S. Cl.
CPC ..... *H03K 19/018521* (2013.01); *H03K 19/21* (2013.01)

(58) Field of Classification Search
CPC .............. H03K 19/018521; H03K 19/21
See application file for complete search history.

(56) References Cited

U.S. PATENT DOCUMENTS

| 7,649,381 | B2* | 1/2010 | Yamashita | ..... H03K 19/018521 326/127 |
| 8,264,269 | B2* | 9/2012 | Uchino | .......... H03K 19/018521 327/333 |
| 2015/0171738 | A1* | 6/2015 | Tanabe | ...................... G06F 1/28 307/24 |

OTHER PUBLICATIONS

Cho et al., "Post-Silicon Voltage-Guard-Band Reduction in a 22nm Graphics Execution Core Using Adaptive Voltage Scaling and Dynamic Power Gating", IEEE International Solid-State Circuits Conference, Feb. 2, 2016, 3 pages.
Tokunaga et al., "A Graphics Execution Core in 22nm CMOS Featuring Adaptive Clocking, Selective Boosting and State-Retentive Sleep", IEEE International Solid-State Circuits Conference, Feb. 10, 2014 3 pages.
(Continued)

*Primary Examiner* — Kenneth B Wells
(74) *Attorney, Agent, or Firm* — Schwabe, Williamson & Wyatt, P.C.

(57) ABSTRACT

Embodiments include circuits, apparatuses, and systems for voltage level shifter monitors. In embodiments, a voltage level shifter monitor may include a first signal generator to generate a signal in a first voltage domain, a second signal generator to generate a second signal in a second voltage domain, where the second digital signal corresponds to the first digital signal, a voltage level shifter replica circuit to convert the first digital signal from the first voltage domain to a third digital signal in the second voltage domain, and a comparison circuit to generate a digital error signal based at least in part on the second digital signal and the third digital signal. Other embodiments may be described and claimed.

13 Claims, 8 Drawing Sheets

(56) References Cited

OTHER PUBLICATIONS

Tschanz et al., "Tunable Replica Circuits and Adaptive Voltage-Frequency Techniques for Dynamic Voltage, Temperature, and Aging Variation Tolerance", Symposium on VLSI Circuits Digest of Technical Papers, (2009), pp. 112-113.
Raychowdhury et al., "Tunable Replica Bits for Dynamic Variation Tolerance in 8T SRAM Arrays" IEEE Journal of Solid-State Circuits, Apr. 2011, vol. 46, No. 4, pp. 797-805.
Sundaram et al., "Adaptive Voltage Frequency Scaling using Critical Path Accumulator implemented in 28nm CPU", 29th International Conference on VLSI Design and 2016 15th International Conference on Embedded Systems, (2016), pp. 565-566.
Beigné et al., "A 460 MHz at 397 mV, 2.6 GHz at 1.3 V, 32 bits VLIW DSP Embedding FMAX Tracking", IEEE Journal of Solid-State Circuits, Jan. 2015, vol. 50, No. 1, pp. 125-136.

* cited by examiner

US 10,243,563 B2

1

VOLTAGE LEVEL SHIFTER MONITOR WITH TUNABLE VOLTAGE LEVEL SHIFTER REPLICA CIRCUIT

FIELD

Embodiments of the present invention relate generally to the technical field of electronic circuits, and more particularly to voltage level shifters.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

Signal communication within a digital system that includes different voltage domains is ensured by the use of voltage level shifters. These circuits are capable of converting a digital signal from one voltage domain to another without affecting its content. Contention-based circuits are used to implement voltage level shifters to ensure their operation within a wide range of voltage domains. However, large voltage differences between voltage domains can degrade the performance level of voltage level shifters or cause their failure. The propagation delay of a level shifter typically strongly depends on the voltage domain difference and is more pronounced when a signal is passed from a lower voltage domain to a higher one. In some situations, a level shifter may fail independently of the operating frequency of a system, resulting in failure of communication between the voltage domains. In some regions of operation before failure of the level shifter, the level shifter may be extremely sensitive to any variation (e.g., droops, noise, etc.) in the supply voltage. In this scenario, circuit paths including level shifters might suddenly limit the operating frequency or cause failures.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
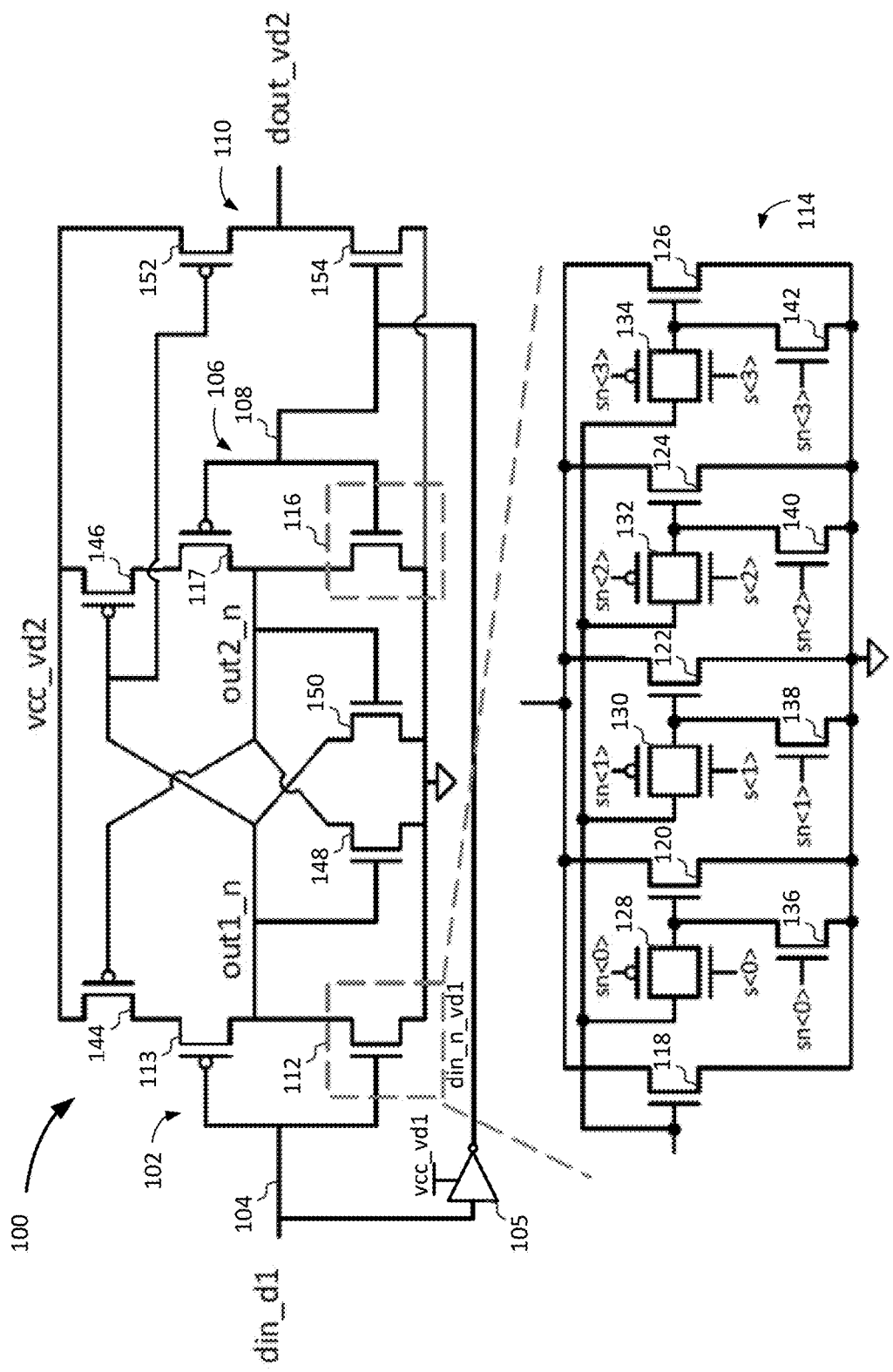
FIG. 1 schematically illustrates a voltage level shifter, in accordance with various embodiments.

Embodiments of the present disclosure describe circuits, apparatuses, and systems for voltage level shifter monitors. In embodiments, a voltage level shifter monitor may include: a first signal generator to generate a signal in a first voltage domain; a second signal generator to generate a second signal in a second voltage domain, where the second digital signal corresponds to the first digital signal; a voltage level shifter replica circuit to convert the first digital signal from the first voltage domain to a third digital signal in the second voltage domain; and a comparison circuit to generate a digital error signal based at least in part on the second digital signal and the third digital signal. In some embodiments, a voltage level shifter monitor may include a voltage level shifter replica tuned to fail before failure of a voltage level shifter monitored by the voltage level shifter monitor, such that corrective action (e.g., adjusting an operating voltage and/or an operating frequency of one or more circuit elements) may be performed to prevent failure of the voltage level shifter. In some embodiments, the voltage level shifter monitor may include a time-to-digital converter (TDC).

In some embodiments, a voltage level shifter replica circuit that may be used in a voltage level shifter monitor may include a first inverter having a first input terminal to receive a first digital signal in a first voltage domain, where the first inverter includes a first N-type metal oxide semiconductor (NMOS) transistor having a programmable first set of fingers. In embodiments, the voltage level shifter replica circuit may also include a second inverter having a second input terminal to receive an inverted version of the first digital signal, where the second inverter includes a second NMOS transistor having a programmable second set of fingers. In various embodiments, the first inverter and the second inverter with the programmable sets of fingers may receive the first digital signal whose voltage swing belongs to the first voltage domain. In some embodiments, the voltage level shifter replica circuit may include an output driver coupled with the first inverter and the second inverter, the output driver to output a second digital signal in a second voltage domain, where the second digital signal is a voltage level shifted version of the first digital signal. In embodiments, the first inverter and the second inverter may operate in the second voltage domain and may be responsible for the voltage shifting.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIG. 1 schematically illustrates a voltage level shifter 100, in accordance with various embodiments. In some embodiments, the voltage level shifter 100 may be a tunable voltage level shifter replica circuit. In FIG. 1, the signals ending with the suffix *_vd1 belong to a first voltage domain (domain of the input signal) and signals ending with the suffix *_vd2 belong to a second voltage domain (domain of the output signal). In various embodiments, the voltage level shifter 100 may include a first inverter 102 having a first input terminal 104 to receive a first digital signal, din_d1, in the first voltage domain and provide an output signal, out1_n. In some embodiments, the voltage level shifter 100 may include an input signal inverter 105 to invert the first digital, din_d1, to provide an inverted version of the first digital signal, din_n_vd1. In various embodiments, the input signal inverter 105 may have a first positive operating voltage, vcc_vd1.

In embodiments, the voltage level shifter 100 may also include a second inverter 106 having a second input terminal 108 to receive the inverted version of the first digital signal, din_n_vd1, and provide an output signal, out2_n. In embodiments, the first inverter 102 and the second inverter 106 may operate in the second voltage domain. In various embodiments, the voltage level shifter 100 may include an output driver 110 coupled with the first inverter 102 and the second inverter 106. In some embodiments, the output driver 110 may output a second digital signal, dout_vd2, in the second voltage domain, where the second digital signal is a voltage level shifted version of the first digital signal, din_d1.

In various embodiments, the first inverter 102 may include a first variable N-type metal oxide semiconductor (NMOS) transistor 112 and a first P-type metal oxide semiconductor (PMOS) transistor 113. In some embodiments, the first variable NMOS transistor 112 may have a programmable first set of fingers 114. In various embodiments, the second inverter 106 may include a second variable NMOS transistor 116 having a programmable second set of fingers and a second PMOS transistor 117. In some embodiments, the first variable NMOS transistor 112 and the second variable NMOS transistor 116 may allow the voltage level shifter 100 to be tuned such that it will fail before other voltage level shifters that may be monitored by a voltage level shifter monitor that incorporates the voltage level shifter 100. In various embodiments, a difference between the first and second voltage domains that is too large may cause a failure because the first variable NMOS transistor 112 and/or the second variable NMOS transistor 116 may lose contention of an output signal, thereby causing a failure of the voltage level shifter 100. In embodiments, the voltage level shifter 100 may be a voltage level shifter replica of one or more monitored voltage level shifters such that its circuit design may be the same as a monitored voltage level shifter, with the exception that in place of the first variable NMOS transistor 112 and the second variable NMOS transistor 116, the voltage level shifter being monitored may have NMOS transistors that are not variable.

In various embodiments, the programmable first set of fingers 114 may include a plurality of switchable conductive paths between a drain terminal and a source terminal of the first variable NMOS transistor 112. In some embodiments, the programmable first set of fingers 114 may include a first NMOS finger transistor 118, a second NMOS finger transistor 120, a third NMOS finger transistor 122, a fourth NMOS finger transistor 124, and a fifth NMOS finger transistor 126. In various embodiments, each of the NMOS finger transistors may have a drain terminal electrically coupled with the drain terminals of the other NMOS finger transistors, and each of the NMOS finger transistors may have a source terminal electrically coupled with the source terminals of the other NMOS finger transistors. In some embodiments, the first NMOS finger transistor 118 may have a gate terminal to receive the first digital signal, din_d1.

In various embodiments, a first transmission gate 128 may be coupled between the gate terminal of the first NMOS finger transistor 118 and a gate terminal of the second NMOS finger transistor 120, a second transmission gate 130 may be coupled between the gate terminal of the first NMOS finger transistor 118 and a gate terminal of the third NMOS finger transistor 122, a third transmission gate 132 may be coupled between the gate terminal of the first NMOS finger transistor 118 and a gate terminal of the fourth NMOS finger transistor 124, and a fourth transmission gate 134 may be coupled between the gate terminal of the first NMOS finger transistor 118 and a gate terminal of the fifth NMOS finger transistor 126. In some embodiments, the transmission gates 128, 130, 132, 134 may selectively allow a signal (e.g., the first digital signal, din_d1) received at the gate terminal of the first NMOS finger transistor 118 to be coupled with the gate terminals of the second NMOS finger transistor 120, the third NMOS finger transistor 122, the fourth NMOS finger transistor 124, and/or the fifth NMOS finger transistor 126, respectively, in response to control signals applied to the transmission gates.

In some embodiments, the control signals may be digital signals designated generally as s<n>, where <n> corresponds to one of the transmission gates. In FIG. 1, signals s<0>, s<1>, s<2>, and s<3> may be applied to the first transmission gate 128, the second transmission gate 130, the third transmission gate 132, and the fourth transmission gate 134, respectively. Inverted versions of the control signals, generally designated as sn<n>, may also be applied to the transmission gates in some embodiments.

In various embodiments, the programmable first set of fingers 114 may also include a first pull-down transistor 136 coupled between ground and the gate terminal of the second NMOS finger transistor 120, a second pull-down transistor 138 coupled between ground and the gate terminal of the third NMOS finger transistor 122, a third pull-down transistor 140 coupled between ground and the gate terminal of the fourth NMOS finger transistor 124, and a fourth pull-down transistor 142 coupled between ground and the gate terminal of the fifth NMOS finger transistor 126. In some embodiments, the pull-down transistors 136, 138, 140, and 142 may be NMOS transistors that each have a gate terminal to receive an inverted version of the control signals sn<n> received by the transmission gates 128, 130, 132, and 134, respectively.

In embodiments, the programmable second set of fingers may be structured in a similar fashion to that shown and/or described with respect to the programmable first set of fingers 114, but with the first NMOS finger transistor of the programmable second set of fingers having a gate terminal to receive the inverted version of the first digital signal rather than the first digital signal. Although one fixed (first NMOS finger transistor 118) and four programmable fingers are shown in the programmable first set of fingers 114, it should be understood that a different number of programmable fingers and/or a different number of fixed fingers may be included in the programmable first set of fingers 114 and/or the programmable second set of fingers in some embodiments.

In various embodiments, the voltage level shifter 100 may include a third PMOS transistor 144 having a source terminal coupled to receive a second positive operating voltage, vcc_vd2, a drain terminal coupled with the source terminal of the first PMOS transistor 113, and a gate terminal coupled to receive the signal out2_n from the second inverter 106. In some embodiments, the voltage level shifter 100 may include a fourth PMOS transistor 146 having a source terminal coupled to receive vcc_vd2, a drain terminal coupled with the source terminal of the second PMOS transistor 117, and a gate terminal coupled to receive the signal out1_n from the first inverter 102.

In various embodiments, the voltage level shifter 100 may include an NMOS transistor 148 having a drain terminal coupled to receive the signal out2_n from the second inverter 106, a source terminal coupled with ground, and a drain terminal coupled to receive the signal out1_n from the first inverter 102. In some embodiments, the voltage level shifter 100 may include an NMOS transistor 150 having a drain terminal coupled to receive the signal out1_n from the first inverter 102, a source terminal coupled with ground, and a gate terminal coupled to receive the signal out2_n from the second inverter 106.

In various embodiments, the output driver 110 may include an output driver PMOS transistor 152 and an output driver NMOS transistor 154. In some embodiments, the output driver PMOS transistor 152 may have a source terminal coupled with vcc_vd2 and a gate terminal coupled to receive the signal out1_n from the first inverter 102. In various embodiments, the output driver NMOS transistor 154 may have a source terminal coupled with ground and a gate terminal coupled to receive the inverted version of the first digital signal, din_n_vd1. In some embodiments, the drain terminal of the output driver PMOS transistor 152 may be coupled with the drain terminal of the output driver NMOS transistor 154 at an output terminal of the output driver 110 to produce the signal dout_vd2.

In some embodiments, contention may occur when din_vd1 rises, therefore partially turning on the first variable NMOS transistor 112. This may contend the voltage value of the signal out1_n with the first PMOS transistor 113 and the third PMOS transistor 144. Similarly, when din_n_vd1 rises, the second variable NMOS transistor 116 may be partially turned on. This may contend the voltage value of the signal out2_n with the second PMOS transistor 117 and the fourth PMOS transistor 146. The contention effect may not limit the functionality of the level shifter when the first variable NMOS transistor 112 and the second variable NMOS transistor 116 are able to pull down out1_n or out2_n, respectively. However, when the cross-domain voltage difference is larger than a certain threshold, the contention effect may be so pronounced that the first variable NMOS transistor 112 and/or the second variable transistor 116 are no longer able to drive the output nodes where signal out1_n and signal out2_n, respectively, are produced, resulting in failure of the voltage level shifter 100.

In various embodiments, the first variable NMOS transistor 112 may be approximately equivalent in circuit behavior to an NMOS transistor used in the same location of a voltage level shifter circuit being monitored when all fingers of the programmable first set of fingers 114 are conducting (e.g., s<0>, s<1>, s<2>, and s<3> are all set to '1'). In some embodiments, contention may be increased in the voltage level shifter 100 by decreasing the number of conducting fingers in the programmable first set of fingers 114 and the programmable second set of fingers (e.g., by setting one or more of s<0>, s<1>, s<2>, and/or s<3> to '0'), effectively downsizing the first variable NMOS transistor 112 and the second variable NMOS transistor 116 in comparison to the NMOS transistors used in the same circuit location of a voltage level shifter circuit being monitored. By doing so, the voltage level shifter 100 may fail before a voltage level shifter being monitored, allowing corrective action to be taken before the voltage level shifter being monitored fails. In embodiments, the first variable NMOS transistor 112 and the second variable NMOS transistor 116 of the voltage level shifter 100 may be structured such that a maximum number of conducting fingers in the programmable first set of fingers 114 and the programmable second set of fingers may be equivalent to the NMOS fingers and/or conducting capacity of the NMOS fingers in the similarly situated NMOS transistors of the voltage level shifter being monitored such that by reducing the number of fingers, the voltage level shifter 100 will always fail first before the voltage level shifter being monitored. In various embodiments, increasing the contention effect inside the voltage level shifter 100 may be performed to mimic and evaluate the performance of the circuit at a cross-domain voltage that is larger than the current one. In some embodiments, changing the contention effect inside the voltage level shifter 100 may be referred to as tuning the voltage level shifter circuit 100 such that the voltage level shifter circuit 100 may serve as a tunable voltage level shifter replica of a voltage level shifter being monitored.

In some embodiments, the voltage level shifter 100 may include NMOS transistors that are not variable in place of the first variable NMOS transistor 112 and/or the second variable NMOS transistor 116, but that are downsized in comparison to the NMOS transistors similarly located in a voltage level shifter being monitored such that the voltage level shifter 100 may still fail before the voltage level shifter being monitored due to the increased contention within the voltage level shifter 100 from the downsized NMOS transistors.

Figure 2:
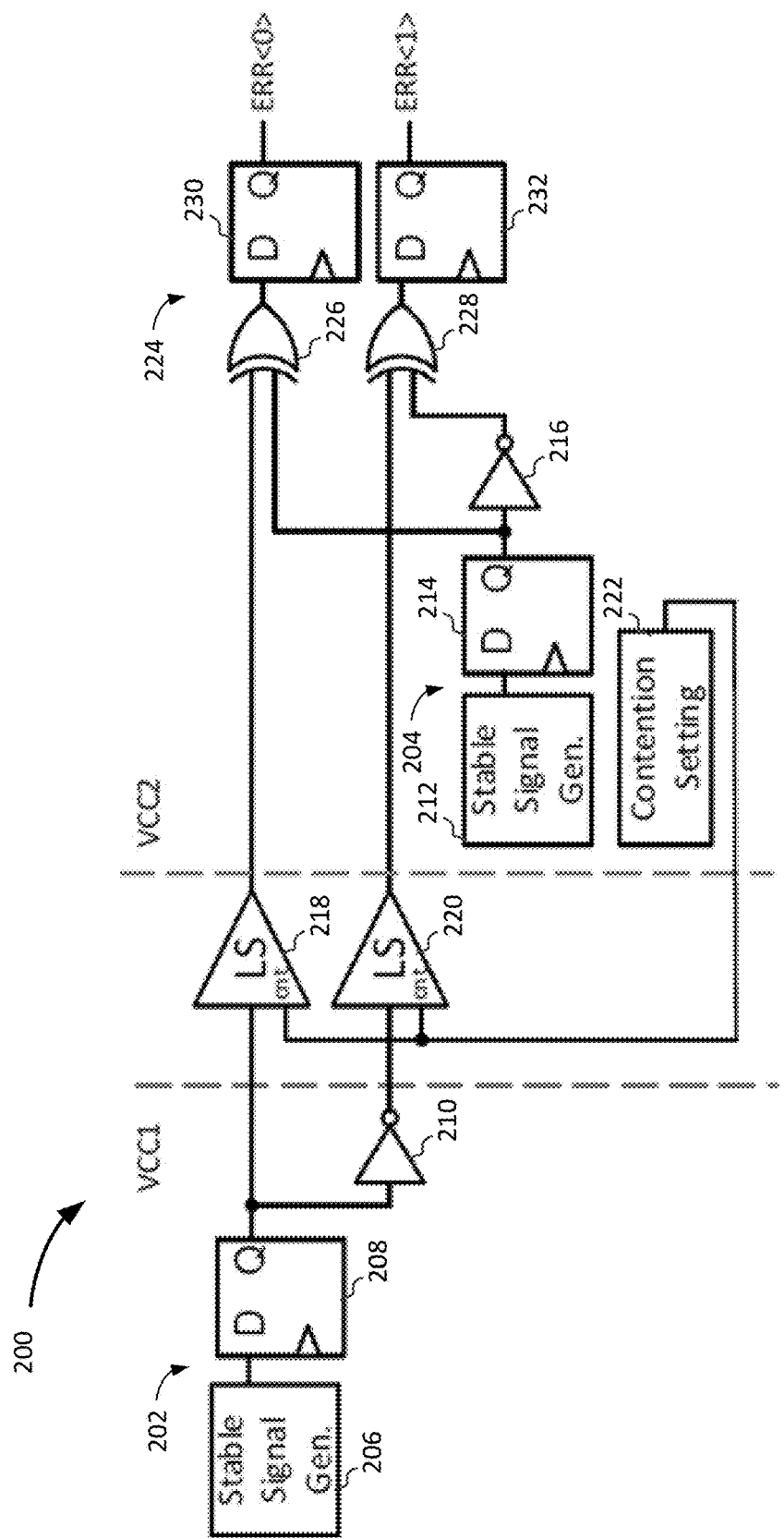
FIG. 2 schematically illustrates a voltage level shifter monitor, in accordance with various embodiments.

FIG. 2 schematically illustrates a voltage level shifter monitor 200, in accordance with various embodiments. In some embodiments, the voltage level shifter monitor 200 may include a first signal generator 202 to generate a first digital signal in a first voltage domain, VCC1. In various embodiments, the voltage level shifter monitor 200 may also include a second signal generator 204 to generate a second digital signal in a second voltage domain, VCC2, where the second digital signal corresponds to the first digital signal. In embodiments, the first signal generator 202 may be replicated on the second voltage domain as the second signal generator 204. In some embodiments, the first signal generator 202 and/or the second signal generator 204 may be implemented simply as a toggling flip-flop to allow a voltage level shifter to be checked at every cycle, or may be implemented as a counter to ensure a voltage level shifter input signal is stable for a predetermined number of clock cycles, thereby allowing a larger time window for the voltage level shifter to settle.

In various embodiments, the first signal generator 202 may include a first signal generation circuit 206 and a first flip-flop 208 to generate the first digital signal at an output of the first flip-flop 208. In some embodiments, the first signal generator 202 may also include a first inverter 210 to receive the first digital signal at an input terminal of the first inverter 210 to produce an inverted version of the first digital signal at an output terminal of the first inverter 210. Similarly, in some embodiments, the second signal generator 204 may include a second signal generation circuit 212 and a second flip-flop 214 to generate the second digital signal at an output of the second flip-flop 214. In various embodiments, the second signal generator 204 may also include a second inverter 216 to receive the second digital signal at an input terminal of the second inverter 216 to produce an inverted version of the second digital signal at an output terminal of the second inverter 216.

In some embodiments, the voltage level shifter monitor 200 may include a first voltage level shifter replica circuit 218 (e.g., voltage shifter 100) to convert the first digital signal from the first voltage domain, VCC1, to a third digital signal in the second voltage domain, VCC2. Similarly, in various embodiments, the voltage level shifter monitor 200 may include a second voltage level shifter replica circuit 220 (e.g., voltage shifter 100) to convert the inverted version of the first digital signal from the first inverter 210 in the first voltage domain, VCC1, to a fourth digital signal in the second voltage domain, VCC2. In embodiments, use of both the first voltage level shifter replica circuit 218 and the second voltage shifter replica circuit 220 may allow simultaneous detection of the effect of both rising and falling transitions.

In some embodiments, the first voltage level shifter replica circuit 218 may include a first contention setting input terminal and the second voltage level shifter replica circuit 220 may include a second contention setting input terminal. In various embodiments, the first contention setting input terminal and/or the second contention setting input terminal may be to receive a contention setting signal that may include one or more of the control signals s<n> and sn<n> shown and described with respect to the voltage level shifter 100 of FIG. 1.

In some embodiments, the voltage level shifter monitor may include a contention setting controller 222 to generate the contention setting signal. In embodiments, the contention setting signal may be used to enable/disable the number of fingers in the variable NMOS transistors of one or more inverters of the voltage level shifter replica circuit 218 and/or the voltage level shifter replica circuit 220. In various embodiments, the first voltage level shifter replica circuit 218 may convert the first digital signal to the third digital signal based at least in part on the contention setting signal received at the first contention setting input terminal and the second voltage level shifter replica circuit 220 may convert the inverted version of the first digital signal in the first voltage domain, VCC1, to the fourth digital signal in the second voltage domain, VCC2, based at least in part on the contention setting signal received at the second contention setting input terminal.

In various embodiments, the voltage level shifter monitor 200 may include a comparison circuit 224 to generate a first digital error signal, ERR<0>, based at least in part on the second digital signal and the third digital signal. In some embodiments, the comparison circuit 224 may also generate a second digital error signal, ERR<1>, based at least in part on the fourth digital signal and an inverted version of the second digital signal.

In various embodiments, the comparison circuit 224 may include a first exclusive or (XOR) gate 226 having a first input terminal to receive the second digital signal and a second input terminal to receive the third digital signal. In some embodiments, the comparison circuit 224 may include a second XOR gate 228 having a third input terminal to receive the fourth digital signal and a fourth input terminal to receive the inverted version of the second digital signal. In various embodiments, the comparison circuit 224 may include a third flip-flop 230 having an input to receive an output of the first XOR gate 226 to produce the first digital error signal, ERR<0>, at an output of the third flip-flop 230. Similarly, in embodiments, the comparison circuit 224 may include a fourth flip-flop 232 having an input to receive an output of the second XOR gate 228 to produce the second digital error signal, ERR<1>, at an output of the fourth flip-flop 232.

In some embodiments, the comparison circuit 224 may compare the output of the first level shifter replica 218 and the second level shifter replica 220 with a golden value from the second signal generator 204. In embodiments, the contention effect may be programmatically increased and the output of the third flip-flop 230 and/or the fourth flip-flop 232 may flag an error as soon as the level shifter replica 218 and/or 220, respectively, is not able to restore a correct signal at its output.

Figure 3:
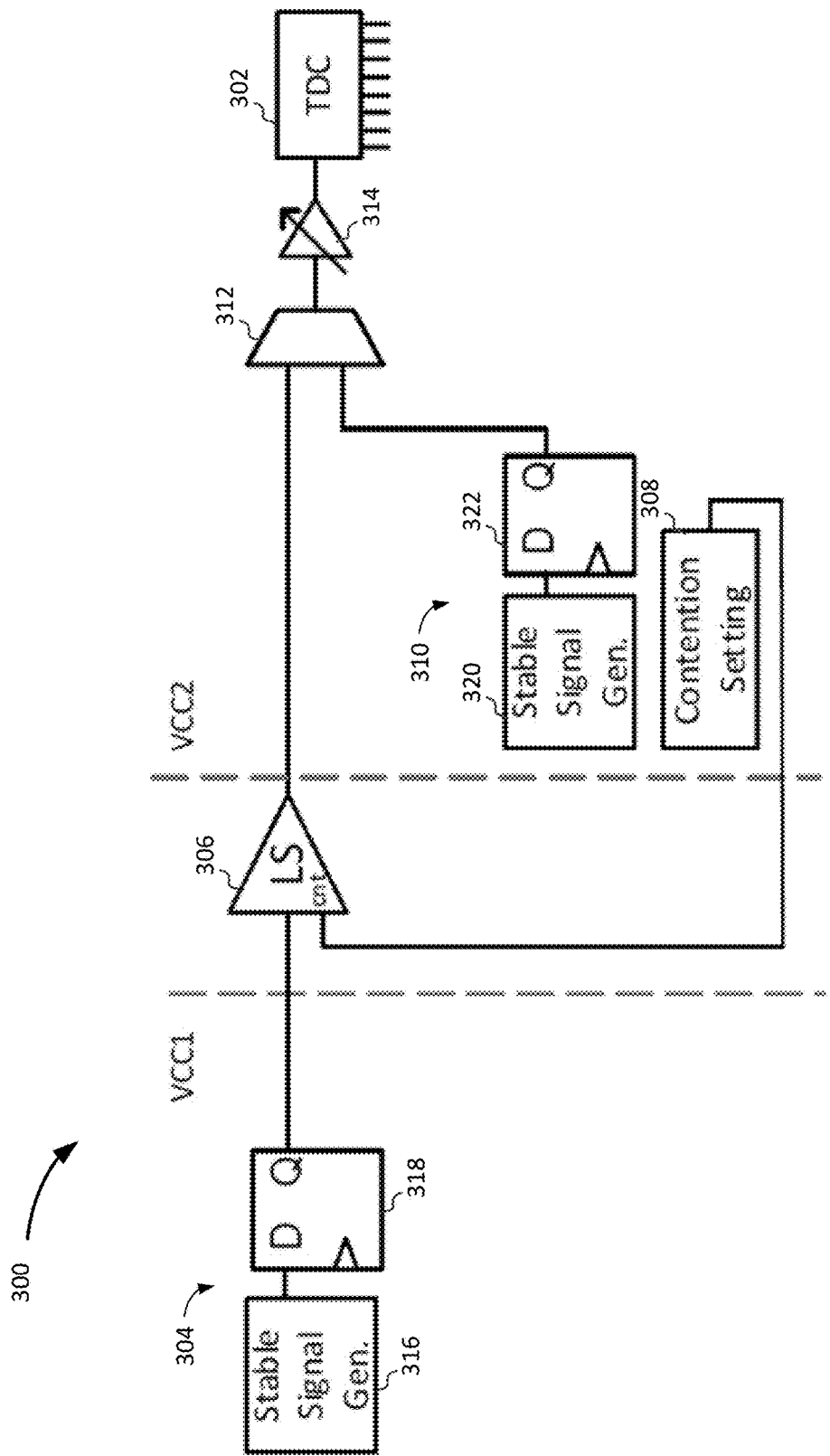
FIG. 3 schematically illustrates a voltage level shifter monitor having a time-to-digital converter, in accordance with various embodiments.

FIG. 3 schematically illustrates a voltage level shifter monitor 300 having a time-to-digital converter (TDC) 302, in accordance with various embodiments. In some embodiments, the voltage level shifter monitor 300 may include a first signal generator 304 to generate a first digital signal in a first voltage domain, VCC1. In various embodiments, the voltage level shifter monitor 300 may also include a voltage level shifter replica circuit 306 (e.g., voltage level shifter 100) to convert the first digital signal to a second digital signal in a second voltage domain, VCC2. In some embodiments, the voltage level shifter replica circuit 306 may include a contention setting input terminal to receive a contention setting signal that may include one or more of the control signals s<n> and/or sn<n> shown and described with respect to the voltage level shifter 100 of FIG. 1. In various embodiments, the voltage level shifter monitor 300 may include a contention setting controller 308 to generate the contention setting signal. In some embodiments, the voltage level shifter replica circuit 306 may convert the first digital signal to the second digital signal based at least in part on the contention setting signal received at the contention setting input terminal.

In some embodiments, the voltage level shifter monitor 300 may also include a second signal generator 310 to generate a third digital signal in a second voltage domain, VCC2, that corresponds to the first digital signal. In various embodiments, the voltage level shifter monitor 300 may include a multiplexer 312 or some other type of signal selector to select the second digital signal or the third digital signal based on a selection input (not shown for clarity). In some embodiments, the voltage level shifter monitor 300 may include a delay line 314 to receive the selected second digital signal or selected third digital signal to produce a delayed second digital signal or a delayed third digital signal. In some embodiments, the delay line 314 may be a programmable delay line.

In various embodiments, the first signal generator 304 include a first signal generation circuit 316 and a first flip-flop 318 to generate the first digital signal at an output of the first flip-flop 318. Similarly, in some embodiments, the second signal generator 310 may include a second signal generation circuit 320 and a second flip-flop 322 to generate the third digital signal at an output of the second flip-flop 322. In various embodiments, the delay line 314 may be set to calibrate a path starting from the launching flip-flop (e.g., first flip-flop 318 or second flip-flop 322) to the TDC 302 to be as long as a clock period. In some embodiments, the TDC 302 may generate a TDC output signal based at least in part on the delayed second digital signal or the delayed third digital signal from the delay line 314. In embodiments, the TDC output signal may represent a propagation delay through the voltage level shifter replica circuit 306.

In various embodiments, the voltage level shifter monitor 300 may be operated in a first mode where the multiplexer 312 is set to pass only an output from the voltage level shifter 306 to detect propagation delay variation through the voltage level shifter 306 by monitoring the output of the TDC 302. In some embodiments, the voltage level shifter monitor 300 may be operated in a second mode where the multiplexer 312 is controlled to alternately selectively pass the output from the voltage level shifter 306 or the second signal generator 310 such that a difference in propagation delay between the two paths may be determined by monitoring the outputs of the TDC 302. In embodiments, an absolute delay of the voltage level shifter 306 may be determined in terms of equivalent logic gates using the second mode. In various embodiments, the voltage level shifter monitor 300 may be used to monitor any delay variation of a level shifter due to variations on the supply voltages (e.g., due to droops), and these delay variations may be quantized by monitoring the output of the TDC 302.

Figure 4:
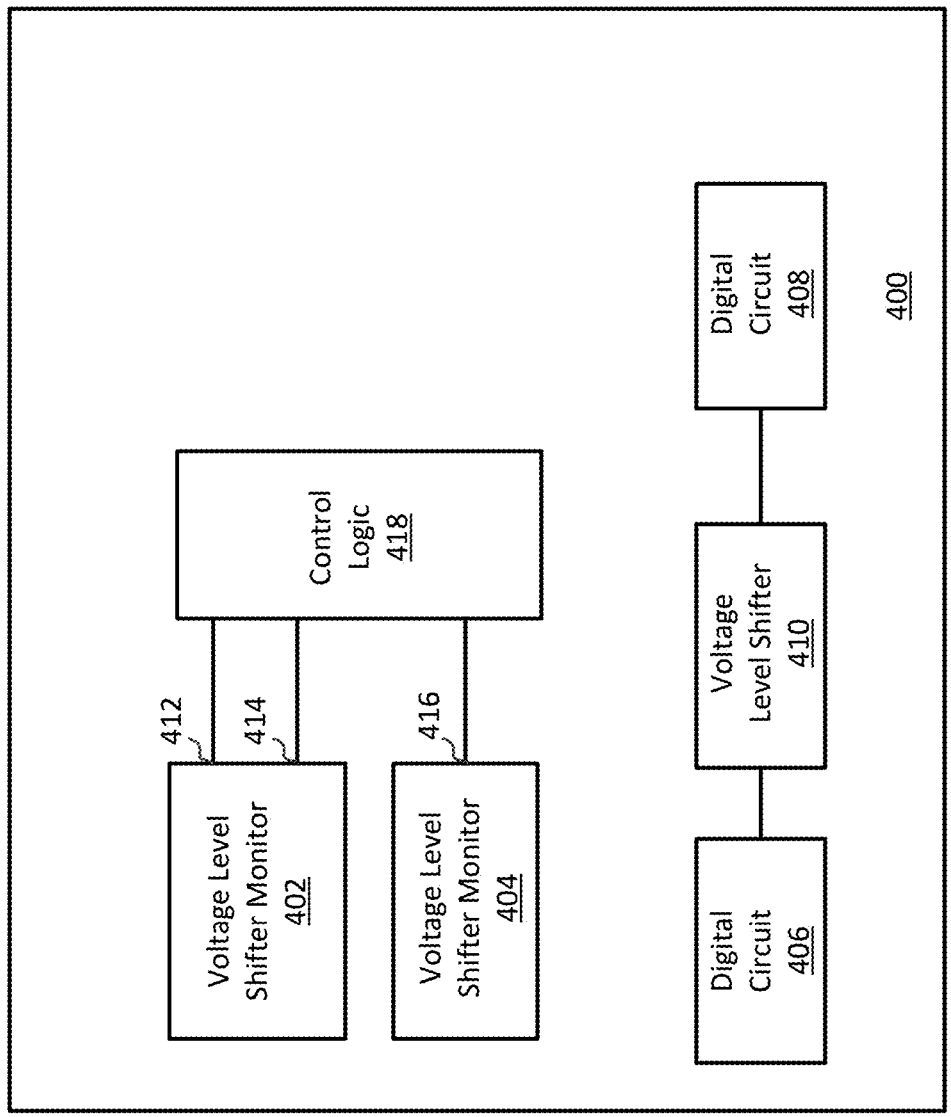
FIG. 4 schematically illustrates an integrated circuit including a voltage level shifter monitor, in accordance with various embodiments.

FIG. 4 schematically illustrates an integrated circuit 400 including a first voltage level shifter monitor 402 (e.g., voltage level shifter monitor 200) and a second voltage level shifter monitor 404 (e.g., voltage level shifter monitor 300), in accordance with various embodiments. In some embodiments, the integrated circuit 400 may include a first digital circuit 406 in a first operating voltage domain (e.g., VCC1 of FIG. 2 and/or FIG. 3), a second digital circuit 408 in a second operating voltage domain (e.g., VCC2 of FIG. 2 and/or FIG. 3), and a voltage level shifter 410 to convert a digital signal from the first voltage domain to the second voltage domain.

In various embodiments, the first voltage level shifter monitor 402 may have a first error signal output terminal 412 to output a first error signal (e.g., ERR<0>) and a second error signal output terminal 414 to output a second error signal (e.g., ERR<1>) to detect a possible contention effect failure and/or warn of a possible operating error of the voltage level shifter 410. In some embodiments, the second voltage level shifter monitor 404 may have a propagation delay output terminal 416 to indicate propagation delay in the voltage level shifter 410. In embodiments, the first voltage level shifter monitor 402 and/or the second voltage level shifter monitor 404 may have one or more voltage level shifter replica circuits (e.g., voltage level shifter 100) that may be replicas of the voltage level shifter 410, but with one or more downsized transistors in comparison to the circuit used for the voltage level shifter 410, as discussed with respect to FIG. 1.

Although only one voltage level shifter 410 is shown, it should be understood that the integrated circuit 400 may include additional voltage level shifters monitored by the first voltage level shifter monitor 402 and/or the second voltage level shifter monitor 404 in some embodiments. In embodiments, the integrated circuit 400 may include additional voltage level shifter monitors. In some embodiments, one of the first voltage monitor 402 or the second voltage monitor 404 may not be included in the integrated circuit 400. In various embodiments, the functionality of the first voltage level shifter monitor 402 and the second voltage level shifter monitor 404 may be integrated into a single voltage level shifter monitor that may include one or more error signal output terminals and one or more propagation delay terminals. In embodiments where the functionality is integrated into a single voltage level shifter, one or more components of the voltage level shifter monitor 200 and/or the voltage level shifter monitor 300 may be implemented with fewer components or a single component (e.g., contention setting controllers 222 and 308 may be implemented with a single contention setting controller; signal generators 202 and 304 may be implemented with a single signal generator, and/or signal generators 204 and 310 may be implemented with a single signal generator).

In some embodiments, the integrated circuit 400 may include control logic 418. In embodiments, the control logic may be coupled with one or more of the first error signal output terminal 412, the second error signal output terminal 412, and the propagation delay output terminal 414. In various embodiments, the control logic 418 may alter one or more of an operating voltage or an operating frequency of the first digital circuit 406 if one or more of the first or second error signals indicates a warning of possible operating error of the voltage level shifter. In some embodiments, the control logic may alter one or more of the operating voltage or the operating frequency of the first digital circuit 406 based at least in part on a signal from the propagation delay output terminal 416 (e.g., if the propagation delay exceeds a predetermined threshold level). In various embodiments, the control logic 418 may alter one or more of an operating voltage or an operating frequency of other components in the integrated circuit 400 (e.g, second digital circuit 408, voltage level shifter 410). In some embodiments, the control logic 418 may alter an operating voltage by sending a control signal to a voltage regulator (not shown for clarity). In embodiments, the control logic 418 may alter an operating frequency by sending a control signal to a system clock signal generator (not shown for clarity) or some other signal generator. In some embodiments, the integrated circuit 400 may enable fine-grain dynamic voltage and frequency scaling (DVFS) while ensuring reliability in designs having different voltage domains. In some embodiments, the integrated circuit 400 may enable voltage guard-band reduction in designs where one or more level shifters may be minimum voltage limiters.

In some embodiments, one or more of the components shown as being included in the integrated circuit 400 may be located in a different circuit communicatively and/or electrically coupled with the integrated circuit 400 (e.g., control logic 418 may be implemented in a controller external to the integrated circuit 400). In various embodiments, one or more components of the integrated circuit 400 may be positioned or connected with an automatic place and route (APR) flow. In some embodiments, some functionality of the voltage level shifter monitor 200 and/or the voltage level shifter monitor 300 may be implemented in control logic 418 rather than in the first voltage level shifter monitor 402 and/or the second voltage level shifter monitor 404 (e.g., contention setting controllers 222 and/or 308 may be implemented in control logic 418).

Figure 5:
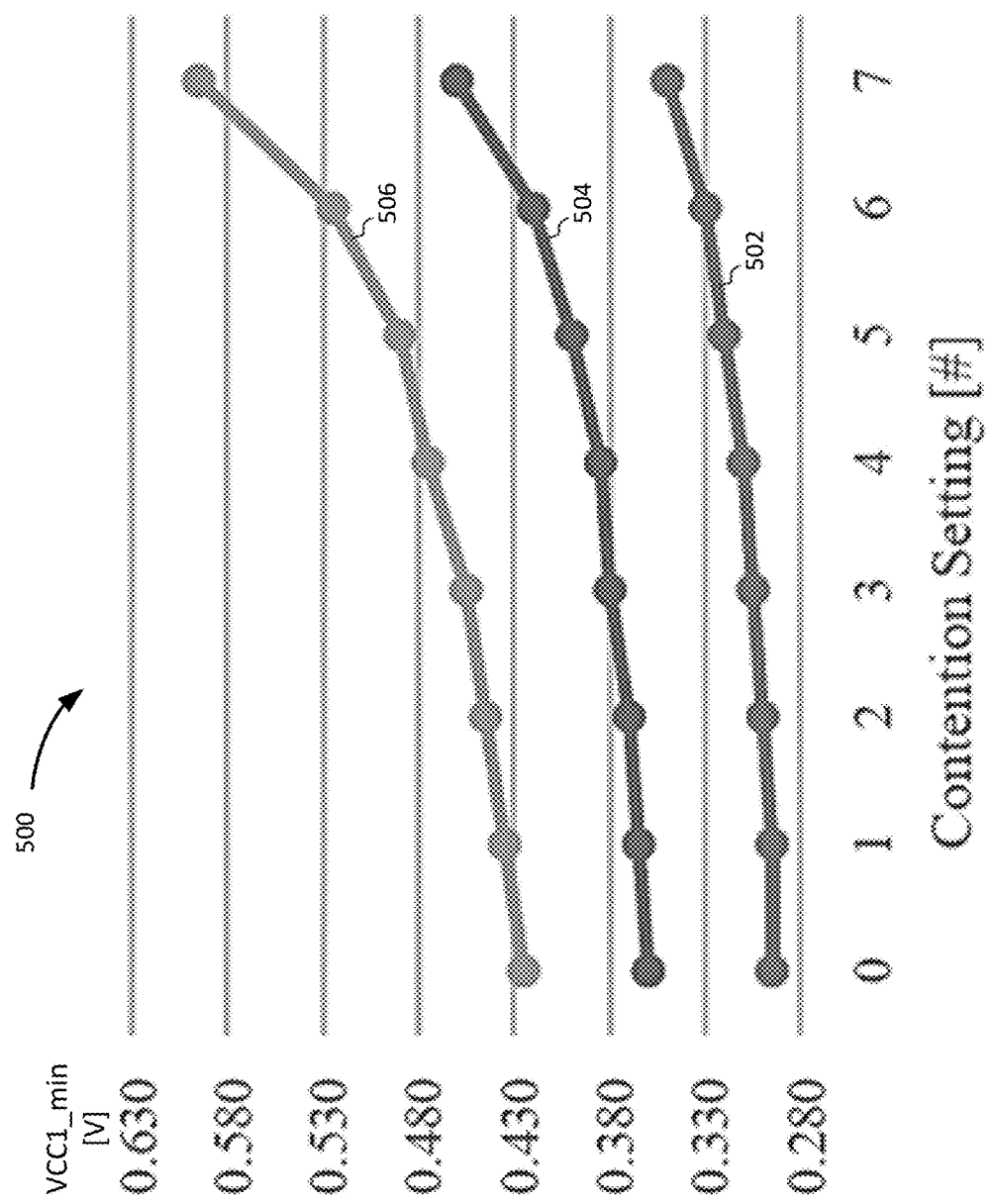
FIG. 5 is a graph showing an effect of contention settings on the voltage level shifter of FIG. 1, in accordance with various embodiments.

FIG. 5 is a graph 500 relating to the voltage level shifter 100 that plots increasing contention setting values along the x-axis and minimum VCC1 values for the first voltage domain before failure along the y-axis, for different values of the second voltage domain VCC2, in accordance with various embodiments. In some embodiments, the increasing contention settings along the x-axis may correspond to reducing the number of active conducting fingers in the programmable first set of fingers 114 and the programmable second set of fingers. The graph 500 includes a first set of values 502 corresponding to VCC2=0.7 volts (V), a second set of values 504 corresponding to VCC2=0.9V, and a third set of values 506 corresponding to VCC2=1.15V. In some embodiments, as the contention setting increases, the number of activated NMOS finger transistors in the variable NMOS transistors decreases. For each set of values, the VCC1_min value may increase with increasing contention values, as shown, in accordance with various embodiments. Accordingly, in some embodiments, by increasing the contention setting (e.g., decreasing the number of active fingers in the programmable first set of fingers 114 and the programmable second set of fingers), the voltage level shifter 100 may fail before a voltage level shifter being monitored so that corrective action may be taken (e.g., by control logic 418 altering an operating voltage and/or frequency) before failure of the voltage level shifter being monitored.

Figure 6:
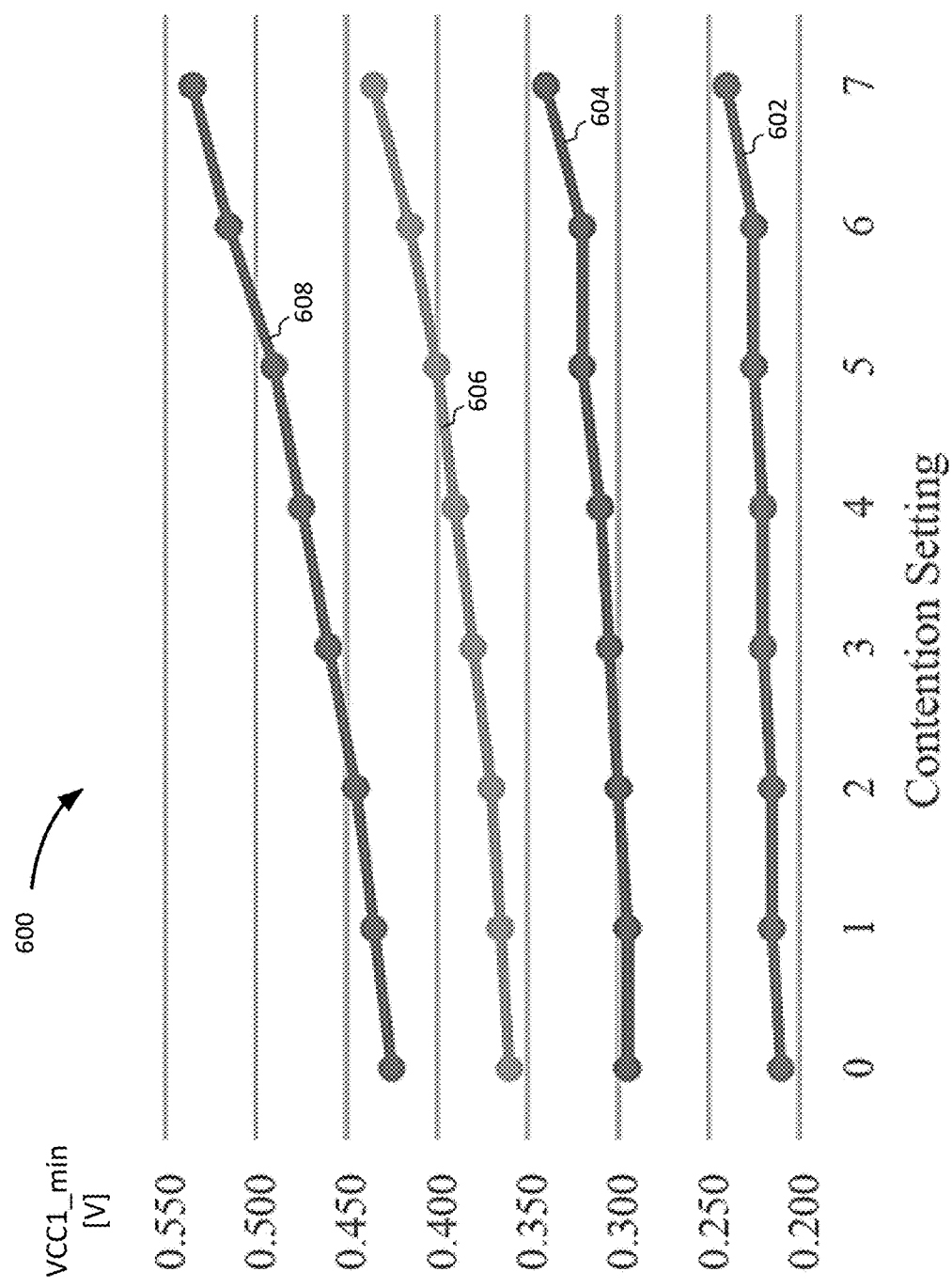
FIG. 6 is a graph showing an effect of contention settings on the voltage level shifter monitor of FIG. 2, in accordance with various embodiments.

FIG. 6 is a graph 600 relating to the voltage level shifter monitor 200 that plots increasing contention setting values along the x-axis and minimum VCC1 values for the first voltage domain before failure along the y-axis for different values of the second voltage domain VCC2, in accordance with various embodiments. In some embodiments, the increasing contention settings may correspond to reducing the number of active conducting fingers in the programmable first set of fingers 114 and the programmable second set of fingers in first voltage level shifter 218 and/or second voltage level shifter 220 of the voltage level shifter monitor 200 described with respect to FIG. 2. The graph 600 includes a first set of values 602 corresponding to VCC2=0.5 volts (V), a second set of values 604 corresponding to VCC2=0.7V, a third set of values 606 corresponding to VCC2=0.9, and a fourth set of values 608 corresponding to VCC2=1.15V. In some embodiments, as the contention setting increases, the number of activated NMOS finger transistors in the variable NMOS transistors decreases. For each set of values, the VCC1_min value may increase with increasing contention values, as shown, in accordance with various embodiments. Accordingly, in some embodiments, by increasing the contention setting (e.g., decreasing the number of active fingers in the programmable first set of fingers 114 and the programmable second set of fingers), the voltage level shifter 100 may fail before a voltage level shifter being monitored, resulting in an error by the voltage level shifter monitor 200 so that corrective action may be taken (e.g., by control logic 418 altering an operating voltage and/or frequency) before failure of the voltage level shifter being monitored.

Figure 7:
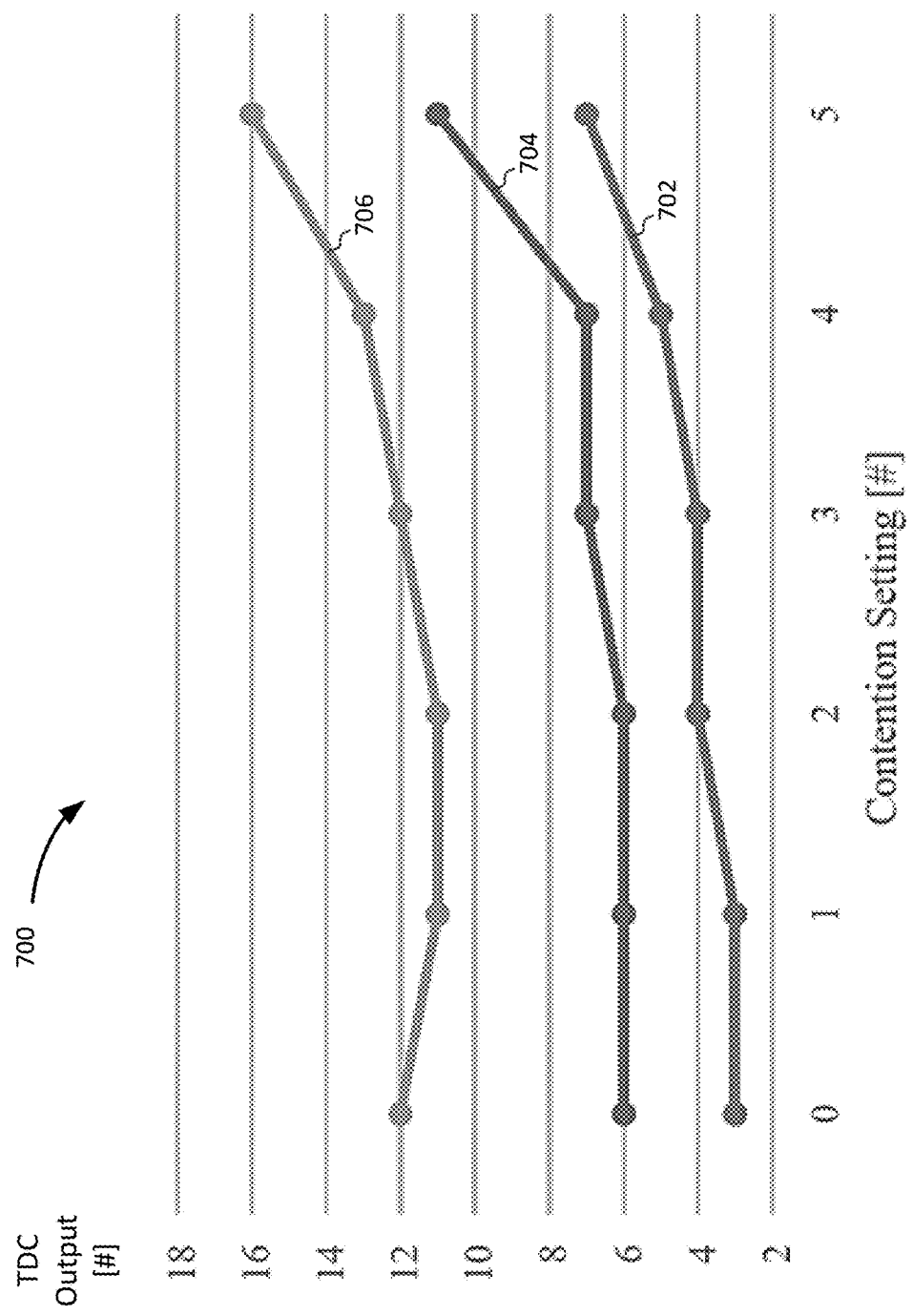
FIG. 7 is a graph showing an effect of contention settings on the voltage level shifter monitor of FIG. 3, in accordance with various embodiments.

FIG. 7 is a graph 700 relating to the voltage level shifter monitor 300 that plots increasing contention setting values along the x-axis and TDC output values along the y-axis for different temperature values, where VCC1=0.41V and VCC2=0.9V, in accordance with various embodiments. In some embodiments, the increasing contention settings may correspond to reducing the number of active conducting fingers in the programmable first set of fingers 114 and the programmable second set of fingers in voltage level shifter 306 of the voltage level shifter monitor 300 described with respect to FIG. 3. The graph 700 includes a first set of values 702 corresponding to a temperature of 25° Celsius (C), a second set of values 704 corresponding to a temperature of 70° Celsius (C), and a third set of values 706 corresponding to a temperature of 105° Celsius (C). In some embodiments, as the contention setting increases, TDC output, representing propagation delay, generally increases for each set of values. Accordingly, in some embodiments, by increasing the contention setting (e.g., decreasing the number of active fingers in the programmable first set of fingers 114 and the programmable second set of fingers), propagation delay may be increased in the voltage level shifter monitor 300 in comparison to a voltage level shifter being monitored so that corrective action may be taken (e.g., by control logic 418 altering an operating voltage and/or frequency) before a predetermined threshold of propagation delay is experienced by the voltage level shifter being monitored.

Figure 8:
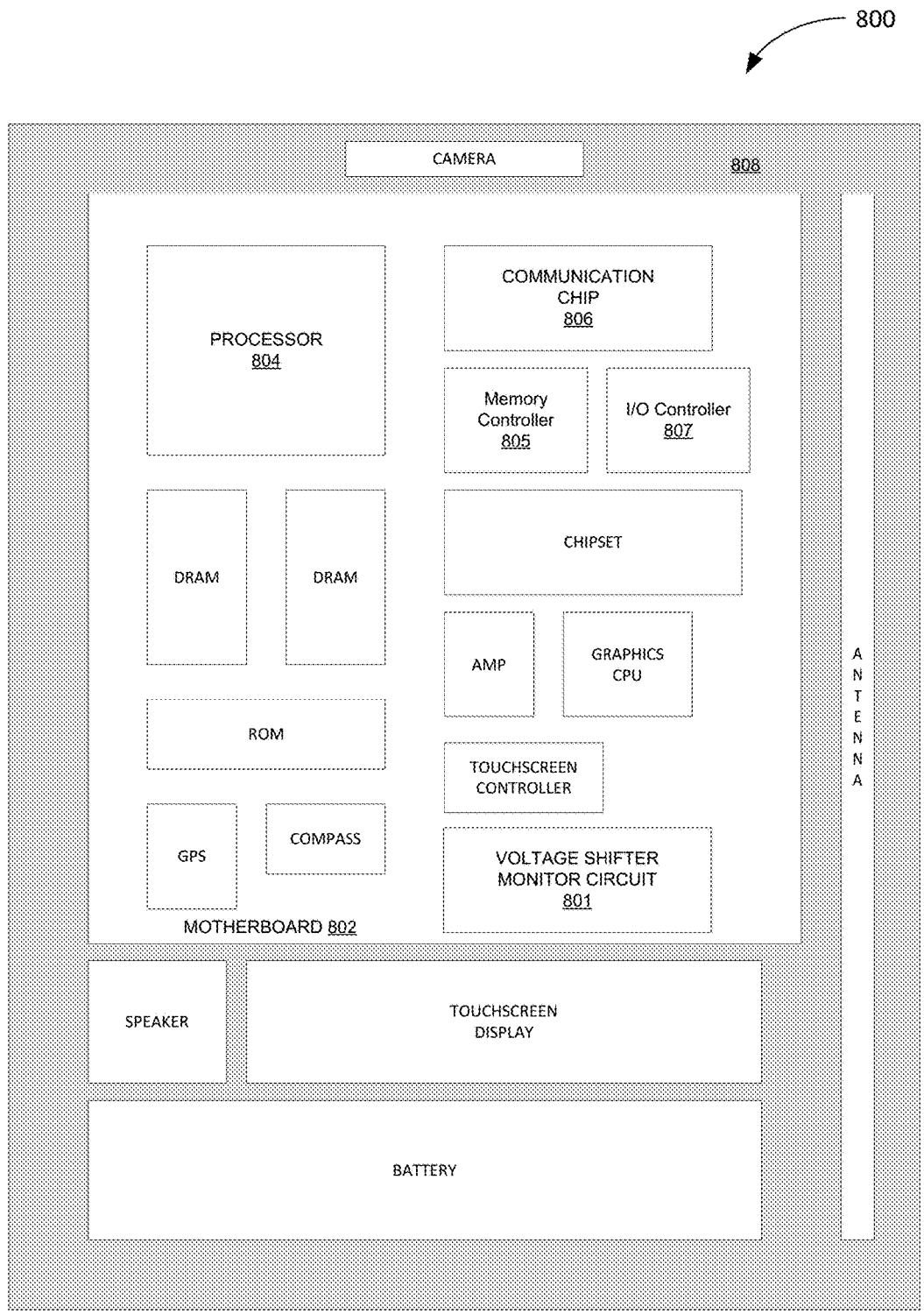
FIG. 8 schematically illustrates a system that may employ the devices and/or circuits described herein, in accordance with various embodiments.

FIG. 8 schematically illustrates an example system (e.g., computing device 800) that may include a voltage level shifter monitor circuit 801 (e.g., a voltage level shifter monitor circuit including all or portions of the voltage level shifter 100 of FIG. 1, the voltage level shifter monitor 200 of FIG. 2, the voltage level shifter monitor 300 of FIG. 3, and/or the integrated circuit 400 of FIG. 4) as described herein, in accordance with various embodiments. Components of the computing device 800 may be housed in an enclosure (e.g., housing 808). A motherboard 802 may include a number of components, including but not limited to a processor 804, a memory controller 805, at least one communication chip 806, and/or an input/output (I/O) controller 807. The processor 804 may be physically and electrically coupled to the motherboard 802. In some implementations, the at least one communication chip 806 may also be physically and electrically coupled to the motherboard 802. In further implementations, the communication chip 806 may be part of the processor 804.

Depending on its applications, computing device 800 may include other components that may or may not be physically and electrically coupled to the motherboard 802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In some embodiments, the voltage level shifter monitor circuit 801 may be integrated with one or more of the other components (e.g., processor 804, communication chip 806, ROM, and/or DRAM) of the computing device 800 such as in a system on a chip (SoC) or an ASIC.

The communication chip 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 806 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 806 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 806 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 806 may operate in accordance with other wireless protocols in other embodiments.

The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, EV-DO, and others.

In various embodiments, one or more components of the computing device 800 may include the voltage level shifter monitor circuit 801 (e.g., a voltage level shifter monitor circuit including all or portions of the voltage level shifter 100 of FIG. 1, the voltage level shifter monitor 200 of FIG. 2, the voltage level shifter monitor 300 of FIG. 3, and/or the integrated circuit 400 of FIG. 4) as described herein. For example, the voltage level shifter monitor circuit 801 may be included in processor 804, communication chip 806, I/O controller 807, memory controller 805, and/or another component of computing device 800. The voltage level shifter monitor circuit 801 may be used to monitor operation of a voltage level shifter, as described herein.

In various implementations, the computing device 800 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples are presented below.

Example 1 may include a voltage level shifter monitor comprising: a first signal generator to generate a first digital signal in a first voltage domain; a second signal generator to generate a second digital signal in a second voltage domain, wherein the second digital signal corresponds to the first digital signal; a voltage level shifter replica circuit to convert the first digital signal from the first voltage domain to a third digital signal in the second voltage domain; and a comparison circuit to generate a digital error signal based at least in part on the second digital signal and the third digital signal.

Example 2 may include the subject matter of Example 1, wherein: the voltage level shifter replica circuit is a first voltage level shifter replica circuit; the digital error signal is a first digital error signal; and the voltage level shifter monitor further comprises: a second voltage level shifter replica circuit to provide a fourth digital signal in the second voltage domain that corresponds to an inverted version of the first digital signal, wherein the comparison circuit is further to generate a second digital error signal based at least in part on the fourth digital signal and an inverted version of the second digital signal.

Example 3 may include the subject matter of Example 2, wherein the comparison circuit includes: a first exclusive or (XOR) gate having a first input terminal to receive the second digital signal and a second input terminal to receive the third digital signal; and a second XOR gate having a third input terminal to receive the fourth digital signal and a fourth input terminal to receive the inverted version of the second digital signal.

Example 4 may include the subject matter of any one of Examples 2-3, wherein the first voltage level shifter replica circuit includes a first contention setting input terminal, the second voltage level shifter replica circuit includes a second contention setting input terminal, the first voltage level shifter replica circuit is to convert the first digital signal to the third digital signal based at least in part on a contention setting signal received at the first contention setting input terminal, and the second voltage level shifter replica circuit is to provide the fourth digital signal based at least in part on the contention setting signal received at the second contention setting input terminal.

Example 5 may include the subject matter of Example 4, further comprising a contention setting controller to generate the contention setting signal.

Example 6 may include the subject matter of any one of Examples 2-5, wherein the first voltage level shifter replica circuit includes a first inverter having a first variable N-type metal oxide semiconductor (NMOS) transistor and a second inverter having a second variable NMOS transistor.

Example 7 may include the subject matter of Example 6, wherein the first variable NMOS transistor includes a first programmable set of fingers set by a contention setting signal and the second variable NMOS transistor includes a second programmable set of fingers set by the contention setting signal.

Example 8 may include the subject matter of any one of Examples 1-7, wherein the first signal generator includes a first signal generation circuit and a first flip flop, the second signal generator includes a second signal generation circuit and a second flip flop, and the comparison circuit includes an XOR gate and a third flip flop.

Example 9 may include a voltage level shifter monitor comprising: a signal generator to generate a first digital signal in a first voltage domain; a voltage level shifter replica circuit to convert the first digital signal to a second digital signal in a second voltage domain; and a time-to-digital converter (TDC) to generate a TDC output signal based at least in part on the second digital signal, wherein the TDC output signal is to indicate a propagation delay through the voltage shifter replica circuit.

Example 10 may include the subject matter of Example 9, wherein the voltage level shifter replica circuit includes a first inverter having a first variable N-type metal oxide semiconductor (NMOS) transistor and a second inverter having a second variable NMOS transistor, wherein the first variable NMOS transistor includes a first programmable set of fingers set by a contention setting signal and the second variable NMOS transistor includes a second programmable set of fingers set by the contention setting signal.

Example 11 may include the subject matter of Example 10, wherein the signal generator is a first signal generator, the TDC output signal is a first TDC output signal, and the voltage level shifter monitor further comprises: a second signal generator to generate a third digital signal in the second voltage domain that corresponds to the first digital signal; and a signal selector to select the second digital signal or the third digital signal, wherein the TDC is to generate the first TDC output signal if the second digital signal is selected and a second TDC output signal based at least in part on the third digital signal if the third digital signal is selected.

Example 12 may include the subject matter of Example 11, further comprising a delay line to receive the selected second digital signal or selected third digital signal to produce a delayed second digital signal or a delayed third digital signal, wherein the TDC is to generate the first TDC output signal based at least in part on the delayed second digital signal or the second TDC output signal based at least in part on the delayed third digital signal.

Example 13 may include the subject matter of any one of Examples 11-12, wherein the signal selector is a multiplexer.

Example 14 may include the subject matter of any one of Examples 10-13, further comprising a contention setting controller to generate the contention setting signal.

Example 15 may include an integrated circuit comprising: a first digital circuit in a first voltage domain; a second digital circuit in a second voltage domain; a voltage level shifter to convert a digital signal from the first operating voltage domain to the second operating voltage domain; and a voltage level shifter monitor having one or more error signal output terminals to warn of a possible operating error of the voltage level shifter.

Example 16 may include the subject matter of Example 15, further comprising control logic coupled with the one or more error signal output terminals, the control logic to alter one or more of an operating voltage or an operating frequency of the first digital circuit in response to one or more of the one or more error signal output terminals indicates a warning of possible operating error of the voltage level shifter.

Example 17 may include the subject matter of any one of Examples 15-16, wherein the voltage level shifter monitor is a first voltage level shifter monitor to detect contention effect failure of the voltage level shifter and the integrated circuit further comprises a second voltage level shifter monitor to detect propagation delay in the voltage level shifter.

Example 18 may include the subject matter of any one of Examples 15-17, wherein the voltage level shifter monitor includes a voltage level shifter replica circuit.

Example 19 may include the subject matter of Example 18, wherein the voltage level replica circuit includes a first inverter having a first variable N-type metal oxide semiconductor (NMOS) transistor and a second inverter having a second variable NMOS transistor.

Example 20 may include the subject matter of Example 19, wherein the first variable NMOS transistor includes a first programmable set of fingers set by a contention setting signal and the second variable NMOS transistor includes a second programmable set of fingers set by the contention setting signal.

Example 21 may include the subject matter of Example 20, further comprising a contention setting controller to generate the contention setting signal.

Example 22 may include a voltage level shifter replica circuit comprising: a first inverter having a first input terminal to receive a first digital signal in a first voltage domain, wherein the first inverter includes a first N-type metal oxide semiconductor (NMOS) transistor having a programmable first set of fingers; a second inverter having a second input terminal to receive an inverted version of the first digital signal, wherein the second inverter includes a second NMOS transistor having a programmable second set of fingers; and an output driver coupled with the first inverter and the second inverter, the output driver to output a second digital signal in a second voltage domain, wherein the second digital signal is a voltage level shifted version of the first digital signal.

Example 23 may include the subject matter of Example 22, wherein the first inverter further includes a first P-type metal oxide semiconductor (PMOS) transistor coupled with the first NMOS transistor and the second inverter further includes a second PMOS transistor coupled with the second NMOS transistor, wherein the voltage level shifter replica circuit further comprises: a third PMOS transistor, wherein a drain terminal of the third PMOS transistor is coupled with a source terminal the first PMOS transistor and a source terminal of the third PMOS transistor is coupled with a positive supply voltage; and fourth PMOS transistor, wherein a drain terminal of the fourth PMOS transistor is coupled with a source terminal of the second PMOS transistor and a source terminal of the fourth PMOS transistor is coupled with the positive supply voltage.

Example 24 may include the subject matter of Example 23, further comprising: a third NMOS transistor, wherein a drain terminal of the third NMOS transistor is coupled with a drain terminal of the second PMOS transistor and a gate terminal of the third NMOS transistor is coupled with a drain terminal of the first PMOS transistor; and a fourth NMOS transistor, wherein a drain terminal of the fourth NMOS transistor is coupled with a drain terminal of the first PMOS transistor and a gate terminal of the fourth NMOS transistor is coupled with a drain terminal of the second PMOS transistor.

Example 25 may include the subject matter of Example 24, wherein the output driver includes a fifth PMOS transistor and a fifth NMOS transistor, wherein a gate terminal of the fifth PMOS transistor is coupled with a gate terminal of the fourth PMOS transistor and a drain terminal of the first NMOS transistor, and wherein a gate terminal of the fifth NMOS transistor is coupled with a gate terminal of the second PMOS transistor and is to receive the inverted version of the first digital signal.

Although certain embodiments have been illustrated and described herein for purposes of description, this application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

What is claimed is:

1. A voltage level shifter monitor comprising:
a first signal generator to generate a first digital signal in a first voltage domain;
a second signal generator to generate a second digital signal in a second voltage domain, wherein the second digital signal corresponds to the first digital signal;
a first voltage level shifter replica circuit to convert the first digital signal from the first voltage domain to a third digital signal in the second voltage domain;
a second voltage level shifter replica circuit to provide a fourth digital signal in the second voltage domain that corresponds to an inverted version of the first digital signal; and
a comparison circuit to:
generate a first digital error signal based at least in part on the second digital signal and the third digital signal; and
generate a second digital error signal based at least in part on the fourth digital signal and an inverted version of the second digital signal.

2. The voltage level shifter monitor of claim 1, wherein the comparison circuit includes:
a first exclusive or (XOR) gate having a first input terminal to receive the second digital signal and a second input terminal to receive the third digital signal; and
a second XOR gate having a third input terminal to receive the fourth digital signal and a fourth input terminal to receive the inverted version of the second digital signal.

3. The voltage level shifter monitor of claim 1, wherein the first voltage level shifter replica circuit includes a first contention setting input terminal, the second voltage level shifter replica circuit includes a second contention setting input terminal, the first voltage level shifter replica circuit is to convert the first digital signal to the third digital signal based at least in part on a contention setting signal received at the first contention setting input terminal, and the second voltage level shifter replica circuit is to provide the fourth digital signal based at least in part on the contention setting signal received at the second contention setting input terminal.

4. The voltage level shifter monitor of claim 3, further comprising a contention setting controller to generate the contention setting signal.

5. The voltage level shifter monitor of claim 1, wherein the first voltage level shifter replica circuit includes a first inverter having a first variable N-type metal oxide semiconductor (NMOS) transistor and a second inverter having a second variable NMOS transistor.

6. The voltage level shifter monitor of claim 5, wherein the first variable NMOS transistor includes a first programmable set of fingers set by a contention setting signal and the second variable NMOS transistor includes a second programmable set of fingers set by the contention setting signal.

7. A voltage level shifter monitor comprising:
a first signal generator to generate a first digital signal in a first voltage domain;
a second signal generator to generate a second digital signal in a second voltage domain, wherein the second digital signal corresponds to the first digital signal;
a voltage level shifter replica circuit to convert the first digital signal from the first voltage domain to a third digital signal in the second voltage domain; and
a comparison circuit to generate a digital error signal based at least in part on the second digital signal and the third digital signal,
wherein the first signal generator includes a first signal generation circuit and a first flip flop, the second signal generator includes a second signal generation circuit and a second flip flop, and the comparison circuit includes an XOR gate and a third flip flop.

8. An integrated circuit comprising:
a first digital circuit in a first operating voltage domain;
a second digital circuit in a second operating voltage domain;
a voltage level shifter to convert a digital signal from the first operating voltage domain to the second operating voltage domain; and
a voltage level shifter monitor having one or more error signal output terminals to warn of a possible operating error of the voltage level shifter, wherein the voltage level shifter monitor includes a voltage level shifter replica circuit with one or more variable transistors.

9. The integrated circuit of claim 8, further comprising control logic coupled with the one or more error signal output terminals, the control logic to alter one or more of an operating voltage or an operating frequency of the first digital circuit in response to one or more of the one or more error signal output terminals indicates a warning of possible operating error of the voltage level shifter.

10. The integrated circuit of claim 9, wherein the voltage level shifter monitor is a first voltage level shifter monitor to detect contention effect failure of the voltage level shifter and the integrated circuit further comprises a second voltage level shifter monitor to detect propagation delay in the voltage level shifter.

11. The integrated circuit of claim 8, wherein the one or more variable transistors include a first variable N-type metal oxide semiconductor (NMOS) transistor and a second variable NMOS transistor, wherein the voltage level shifter replica circuit includes a first inverter having the first variable NMOS transistor and a second inverter having the second variable NMOS transistor.

12. The integrated circuit of claim 11, wherein the first variable NMOS transistor includes a first programmable set of fingers set by a contention setting signal and the second variable NMOS transistor includes a second programmable set of fingers set by the contention setting signal.

13. The integrated circuit of claim 12, further comprising a contention setting controller to generate the contention setting signal.

* * * * *